United States Patent
Lai et al.

(10) Patent No.: US 9,257,900 B2
(45) Date of Patent: Feb. 9, 2016

(54) SIGNAL PEAK DETECTOR AND DETECTION METHOD, AND CONTROL IC AND METHOD FOR A PFC CONVERTER

(71) Applicant: Richtek Technology Corporation, Zhubei, Hsinchu County (TW)

(72) Inventors: Yung-Chih Lai, Miaoli (TW); Jyun-Che Ho, Chiayi County (TW); Isaac Y. Chen, Jubei (TW)

(73) Assignee: RICHTEK TECHNOLOGY CORPORATION, Hsinchu County (TW)

( * ) Notice: Subject to any disclaimer, the term of this patent is extended or adjusted under 35 U.S.C. 154(b) by 156 days.

(21) Appl. No.: 14/061,317

(22) Filed: Oct. 23, 2013

(65) Prior Publication Data

US 2014/0117947 A1 May 1, 2014

(30) Foreign Application Priority Data

Oct. 25, 2012 (TW) .............................. 101139510 A

(51) Int. Cl.
| | | |
|---|---|---|
| H03M 1/00 | (2006.01) | |
| H02M 1/42 | (2007.01) | |
| H03K 23/00 | (2006.01) | |
| H03K 21/38 | (2006.01) | |

(52) U.S. Cl.
CPC .............. *H02M 1/42* (2013.01); *H02M 1/4225* (2013.01); *H03K 21/38* (2013.01); *H03K 23/00* (2013.01); *Y02B 70/12* (2013.01); *Y02B 70/126* (2013.01)

(58) Field of Classification Search
CPC .... H03D 1/02; H04L 27/30; H04L 25/03057; H03M 1/48; H03M 3/49
USPC ......... 323/205, 207, 222, 282; 363/20, 21.12, 363/39, 44, 50, 89, 131; 375/233, 262, 348, 375/222, 354, 373; 341/132, 138, 139, 158, 341/164
See application file for complete search history.

(56) References Cited

U.S. PATENT DOCUMENTS

| | | | |
|---|---|---|---|
| RE28,513 E  * | 8/1975 | Suzuki et al. .................. 600/538 |
| 4,990,912 A  * | 2/1991 | Selwa ...................... H03M 1/48 |
| | | | 341/132 |
| 5,381,052 A  * | 1/1995 | Kolte ...................... H03K 5/084 |
| | | | 327/58 |
| 6,064,238 A  * | 5/2000 | Wight ..................... G01R 19/04 |
| | | | 327/58 |
| 6,731,230 B1 | 5/2004 | Mercado et al. |
| 7,436,906 B2 * | 10/2008 | Goto .................... H04L 27/2662 |
| | | | 327/141 |
| 7,554,079 B2 * | 6/2009 | Rai ...................... G01D 5/24461 |
| | | | 250/231.13 |
| 7,698,077 B2 * | 4/2010 | Brown et al. .................... 702/57 |
| 2010/0123447 A1* | 5/2010 | Vecera et al. .................. 323/290 |

* cited by examiner

*Primary Examiner* — Rajnikant Patel
(74) *Attorney, Agent, or Firm* — Muncy, Geissler, Olds & Lowe, P.C.

(57) ABSTRACT

A control integrated circuit for a power factor correction converter has a pin for detecting an alternating-current information and a direct-current information of an input signal. The control integrated circuit comprises a signal peak detector for detecting a peak value of the input signal to the pin to obtain the direct-current information of the input signal. Since the alternating-current information and the direct-current information of the input signal can be obtained through the same pin, the pin count of the control integrated circuit can be decreased.

8 Claims, 10 Drawing Sheets

SIGNAL PEAK DETECTOR AND DETECTION METHOD, AND CONTROL IC AND METHOD FOR A PFC CONVERTER

FIELD OF THE INVENTION

The present invention is related generally to a signal peak detector and detection method and, more particularly, to a signal peak detector and detection method for a power factor correction (PFC) converter.

BACKGROUND OF THE INVENTION

A power factor correction (PFC) converter requires alternating-current (AC) information and direct-current (DC) information of the input signal to the PFC converter for various applications, such as establishing a current in proportion to the waveform of the input signal, detecting the valley of the input signal, and determining total harmonic distortion (THD) to improve trip point by using the AC information, and determining the value of the input signal, achieving brown in/brown out protection, etc. by using the DC information. Traditionally, the DC information is obtained by detecting the peak or root-mean-square (RMS) value of the input signal.

FIG. 1 shows a traditional control integrated circuit (IC) 2 for a PFC converter. An AC voltage Vac supplied to the PFC converter is rectified by a bridge rectifier 4 and becomes an input signal Vin, which is divided by a divider circuit 6 to generate an input signal Vd for a pin MULT of the control IC 2. The control IC 2 may obtain the alternating-current information of the input signal Vin from the input signal Vd on the pin MULT. The PFC converter uses a signal peak detector 8 to detect the peak of the input signal Vd to obtain the DC information of the input signal Vin. In the signal peak detector 8, an ideal diode 10 consisting of a diode and an operational amplifier provides the input signal Vd to a capacitor C1, to generate a peak signal Vpeak. A conversion circuit 12 obtains the DC information of the input signal Vin according to the peak signal Vpeak. A resistor Rff connected in parallel to the capacitor C1 acts as a discharging path for allowing the capacitor C1 to discharge slowly. However, this method for detecting the DC information requires a large capacitor C1 to stabilize the peak signal Vpeak. Since such a large capacitor C1 cannot be integrated into the control IC 2, an additional pin VFF has to be used to connect the large capacitor C1 outside the control IC 2. Thus, the traditional PFC converter needs two pins MULT and VFF to obtain the alternating-current information and the DC information of the input signal Vin.

In addition, when the peak of the input signal Vin drops, the method using the capacitor C1 to obtain the peak signal Vpeak has relatively slow transient response. Particularly, referring to FIG. 2, between time points t1 and t2, the input signal Vin turns to a high peak from a low peak, and the peak signal Vpeak on the capacitor C1 soon raises to a second level VL2 from a first level VL1. However, when the input signal Vin turns from a high peak to a low peak, as happening between time points t3 and t4, since the capacitor C1 discharges slowly, the peak signal Vpeak will not drop to the first level VL from the second level VL2 until several cycles TP of the input signal Vin lapse. Thus, in the signal peak detector 8 of FIG. 1, when the input signal Vin has its peak turning from high to low, the transient response of the peak signal Vpeak is relatively slow.

In some applications, a PFC converter may give up the alternating-current information and only obtain the DC information in order to reduce the number of the pins required. FIG. 3, FIG. 4 and FIG. 5 show detectors for detecting the DC information without obtain the alternating-current information. FIG. 3 is a conventional RMS detector 14, which comprises a filter that consists of resistors R3 and R4 and a capacitor C1 and serves to obtain an RMS value Vrms of the input signal Vin for the control IC 2. The RMS value Vrms has the DC information of the input signal Vin, so the control IC 2 can accordingly obtain the DC information of the input signal Vin. FIG. 4 shows another signal peak detector 8, which comprises a capacitor C1, resistors R3, R4, Rff and a diode D1. The resistors R3 and R4 divide the input signal Vin to generate a input signal Vd. The input signal Vd charges the capacitor C1 via the diode D1 to generate a peak signal Vpeak for the control IC 2 such that the control IC 2 can accordingly obtain the DC information of the input signal Vin. The resistor Rff that is connected in parallel with the capacitor C1 acts as a discharging path for the capacitor C1 to discharge slowly. In the signal peak detector 8 of FIG. 4, the forward bias of the diode D1 causes an error between the peak signal Vpeak and the peak of the input signal Vd. This error can be eliminated by adding a diode D2 between an anode of the diode D1 and the resistor R4, as shown in FIG. 5. However, the detectors of FIG. 3, FIG. 4 and FIG. 5 also have the problem about slow transient response when the peak of the input signal Vin turns to low from high.

U.S. Pat. No. 6,731,230 teaches a signal peak detection method that detects an input signal to generate an output peak signal. During the input signal rises, if the output peak signal is smaller than the input signal, the output peak signal is risen in a relatively high speed. During the input signal falls, a reference voltage is used for detecting the input signal to remain the output peak signal at the peak voltage level of the input signal. When the input signal remains lower than the reference voltage over a predetermined number of clock cycles, the output peak signal is stopped from dropping with the input signal. However, this method also has the problem about slow transient response when the peak of the input signal turns to low from high.

SUMMARY OF THE INVENTION

An objective of the present invention is to provide a control integrated circuit and method for a PFC converter using one pin to obtain the alternating-current information and DC information of an input signal.

Another objective of the present invention is to provide a signal peak detector and detection method for a PFC converter.

Further objective of the present invention is to provide a signal peak detector with quick transient response and a detection method thereof.

According to the present invention, a control integrated circuit for a power factor correction converter comprises: a pin for receiving an input signal for the control integrated circuit to obtain an alternating-current information of the input signal; and a signal peak detector connected to the pin, for detecting a peak of the input signal to generate an output peak signal having a DC information of the input signal. The signal peak detector comprising: a first comparator for generating a comparison signal when the input signal is greater than an internal peak signal; a first counter for increasing a count it outputs according to the comparison signal and resetting the count according to a resetting signal; a first digital-to-analog converter for converting the count into the internal peak signal; a storage unit for obtaining from the first counter and storing the count in response to a sampling signal; a second comparator for generating the sampling signal when the input signal is lower than a reference voltage, and generating the resetting signal when the sampling signal ends; and a second digital-to-analog converter for converting the count stored in the storage unit into the output peak signal. The control integrated circuit can obtain the alternating-current information and DC information of the input signal by one pin to decrease the number of the pins. The first counter of the signal peak detector will re-count in each period of the input signal such that the output peak signal can immediately adjust to a target level at next period. Thereby, the signal peak detector has a quick transient response whether the peak of the input signal turns to high from low or turns to low from high.

According to the present invention, a control integrated circuit for a power factor correction converter comprises: a pin for receiving an input signal for the control integrated circuit to obtain an alternating-current information of the input signal; and a signal peak detector connected to the pin, for detecting a peak of the input signal to generate an output peak signal having a DC information of the input signal. The signal peak detector comprising: a comparator for comparing the input signal with the output peak signal to generate a rising signal or a falling signal; a counter for increasing and decreasing a count it outputs according to the rising signal and the falling signal, respectively; and a digital-to-analog converter for converting the count into the output peak signal having a DC information of the input signal. Wherein the count is increased in a first frequency and is decreased in a second frequency that is lower than the first frequency. The control integrated circuit can obtain the alternating-current information and DC information of the input signal by one pin to decrease the number of the pins.

According to the present invention, a signal peak detector comprises: a first comparator for generating a comparison signal when an input signal is higher than an internal peak signal; a first counter for increasing a count it outputs according to the comparison signal, and resetting the count according to a resetting signal; a first digital-to-analog converter for converting the count into the internal peak signal; a storage unit for obtaining from the first counter and storing the count according to a sampling signal; a second comparator for generating the sampling signal when the input signal is lower than a reference voltage, and generating the resetting signal when the sampling signal ends; and a second digital-to-analog converter for converting the count stored in the storage unit into an output peak signal related to a peak of the input signal. The first counter of the signal peak detector will re-count in each period of the input signal such that the output peak signal can immediately adjust to a target level at next period. Thereby, the signal peak detector has a quick transient response whether the peak of the input signal turns to high from low or turns to low from high.

According to the present invention, a signal peak detector comprises: a comparator, for comparing an input signal of the signal peak detector with an output peak signal to generate a rising signal or a falling signal; a counter connected to the comparator, for increasing and decreasing a count it outputs according to the rising signal or the falling signal, respectively; and a digital-to-analog converter connected to the counter and the comparator, for converting the count to generate the output peak signal. Wherein the count is increased in a first frequency and is decreased in a second frequency that is lower than the first frequency.

According to the present invention, a control method for a power factor correction converter comprises the steps of: using a pin to receive an input signal to obtain the alternating-current information of the input signal; providing a count; converting the count to generate an internal peak signal; increasing the count when the input signal is greater than the internal peak signal; storing the count when the input signal is smaller than a reference voltage; generating an output peak signal that has the DC information of the input signal according to the stored count; and resetting the count after the count is stored. The control method can obtain the alternating-current information and DC information of the input signal by one pin to decrease the number of the pins. In addition, the count will re-count in each period of the input signal such that the output peak signal can immediately adjust to a target level at next period. Thereby, the control method has a quick transient response whether the peak of the input signal turns to high from low or turns to low from high.

According to the present invention, a control method for a power factor correction converter comprises the steps of: using one pin to receive an input signal to obtain the alternating-current information of the input signal; providing a count; converting the count to generate an output peak signal that has the DC information of the input signal; increasing the count in a first frequency when the input signal is greater than the output peak signal; and decreasing the count in a second frequency that is smaller than the first frequency when the input signal is smaller than the output peak signal. The control method can obtain the alternating-current information and DC information of the input signal by one pin to decrease the number of the pins.

According to the present invention, a signal peak detection method, for detecting a peak of an input signal to generate an output peak signal, comprises the steps of: providing a count; converting the count to generate an internal peak signal; increasing the count when the input signal is greater than the internal peak signal; storing the count when the input signal is smaller than a reference voltage; generating the output peak signal according to the stored count; and resetting the count after the count is stored. The control method will re-count the count in each period of the input signal such that the output peak signal can immediately adjust to a target level at next period. Thereby, the control method has a quick transient response whether the peak of the input signal turns to high from low or turns to low from high.

According to the present invention, a signal peak detection method, for detecting a peak of an input signal to generate an output peak signal, comprises the steps of: providing a count; converting the count to generate the output peak signal; increasing the count in a first frequency when the input signal is greater than the output peak signal; and decreasing the count in a second frequency that is smaller than the first frequency when the input signal is smaller than the output peak signal.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
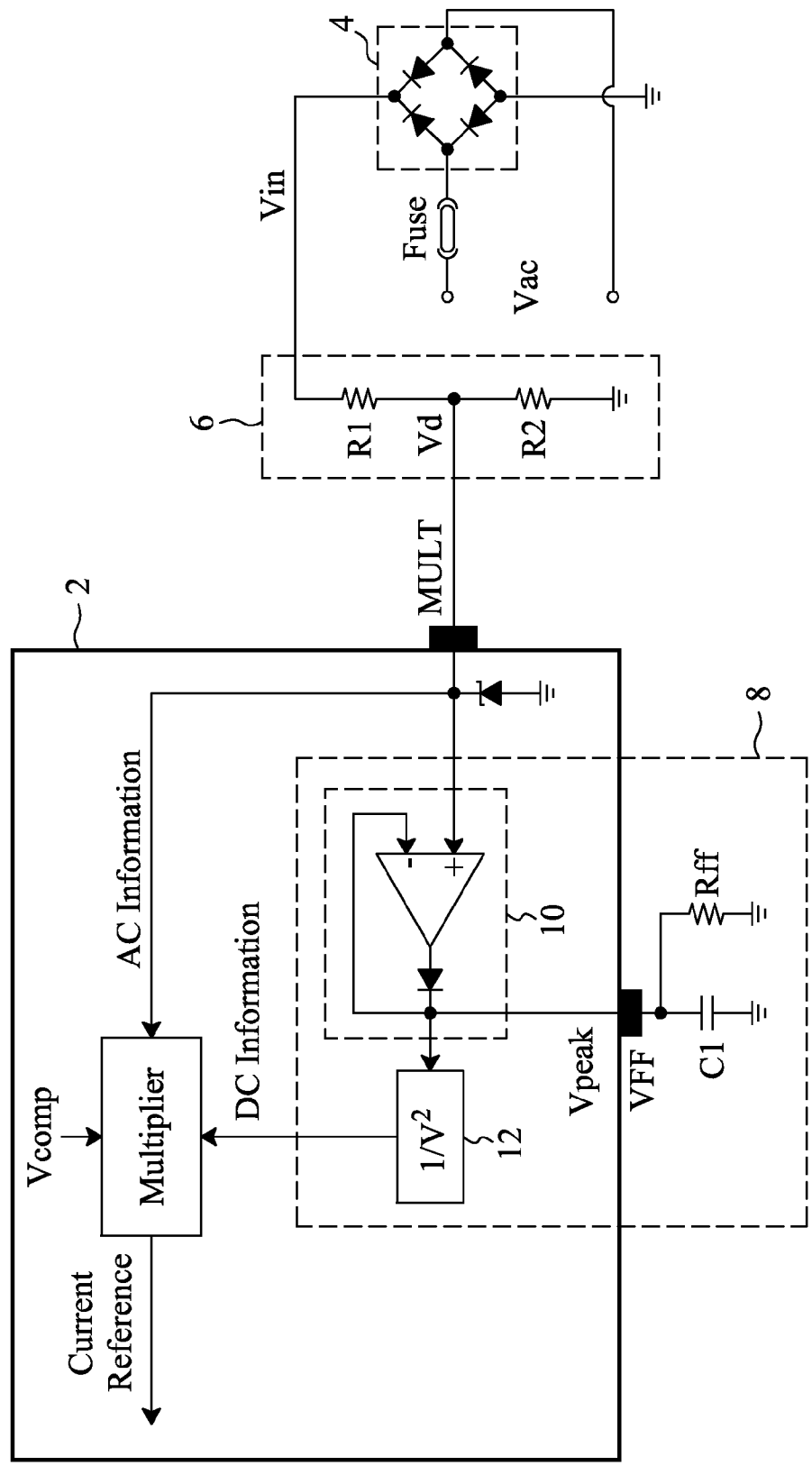
FIG. 1 shows a traditional control IC for a PFC converter.
Figure 2:
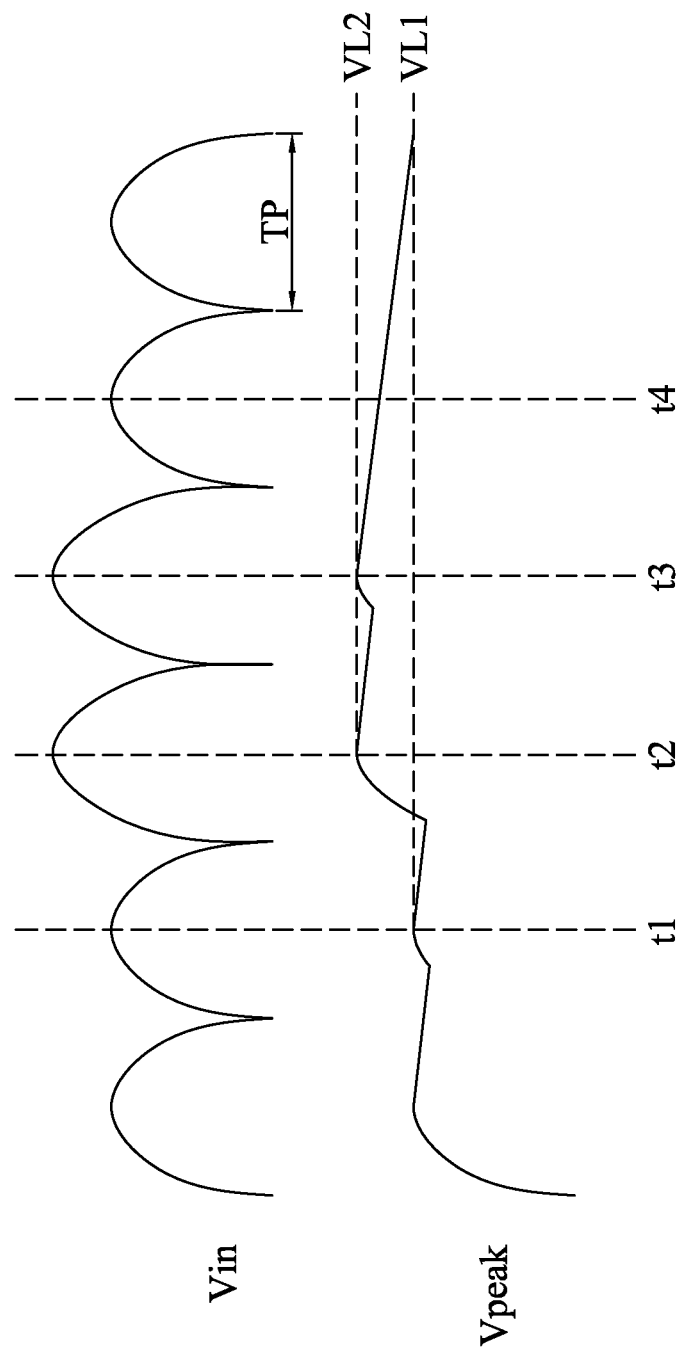
FIG. 2 shows the transient response of the peak signal Vpeak of FIG. 1.
Figure 3:
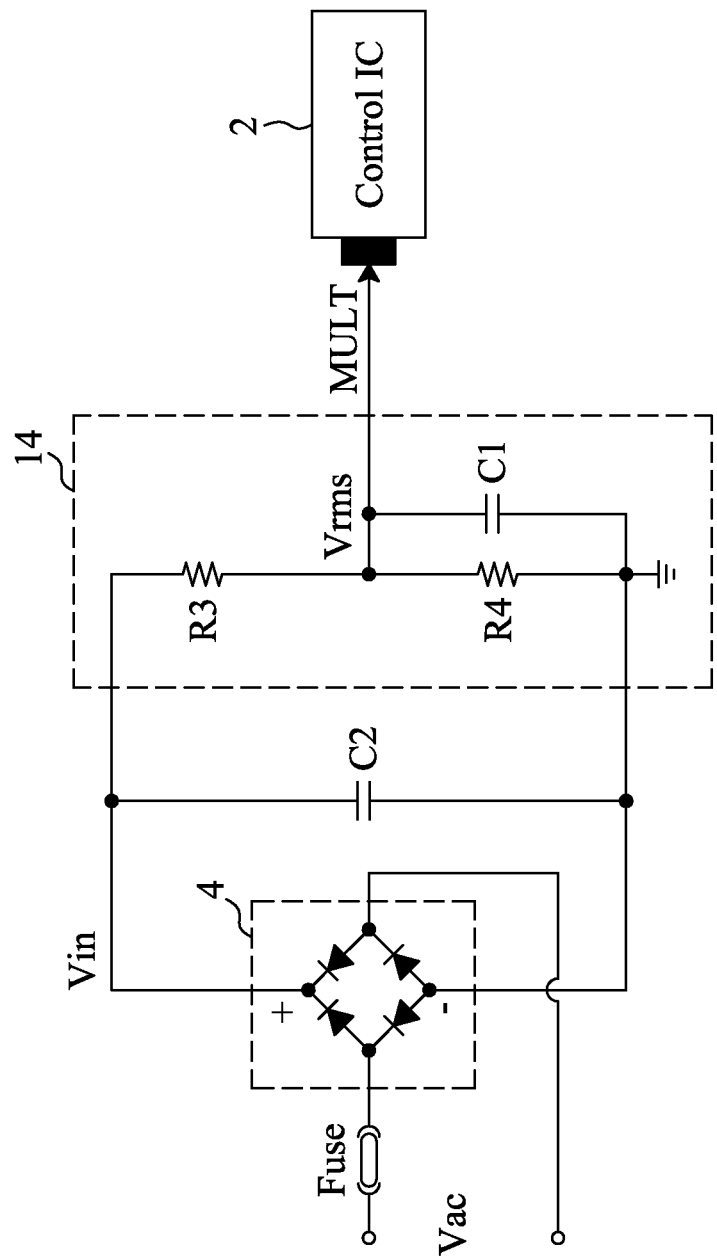
FIG. 3 shows a conventional RMS detector applicable to a PFC converter.
Figure 4:
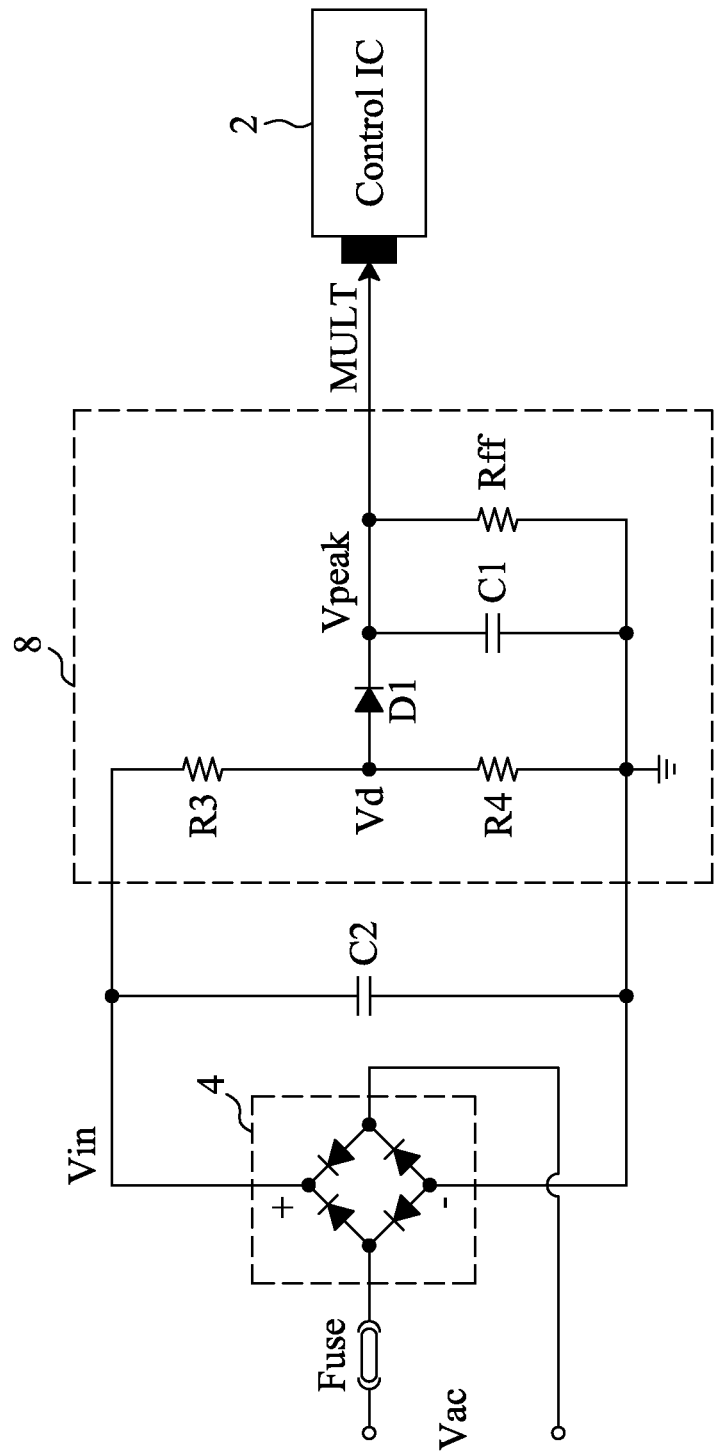
FIG. 4 shows a conventional signal peak detector applicable to a PFC converter.
Figure 5:
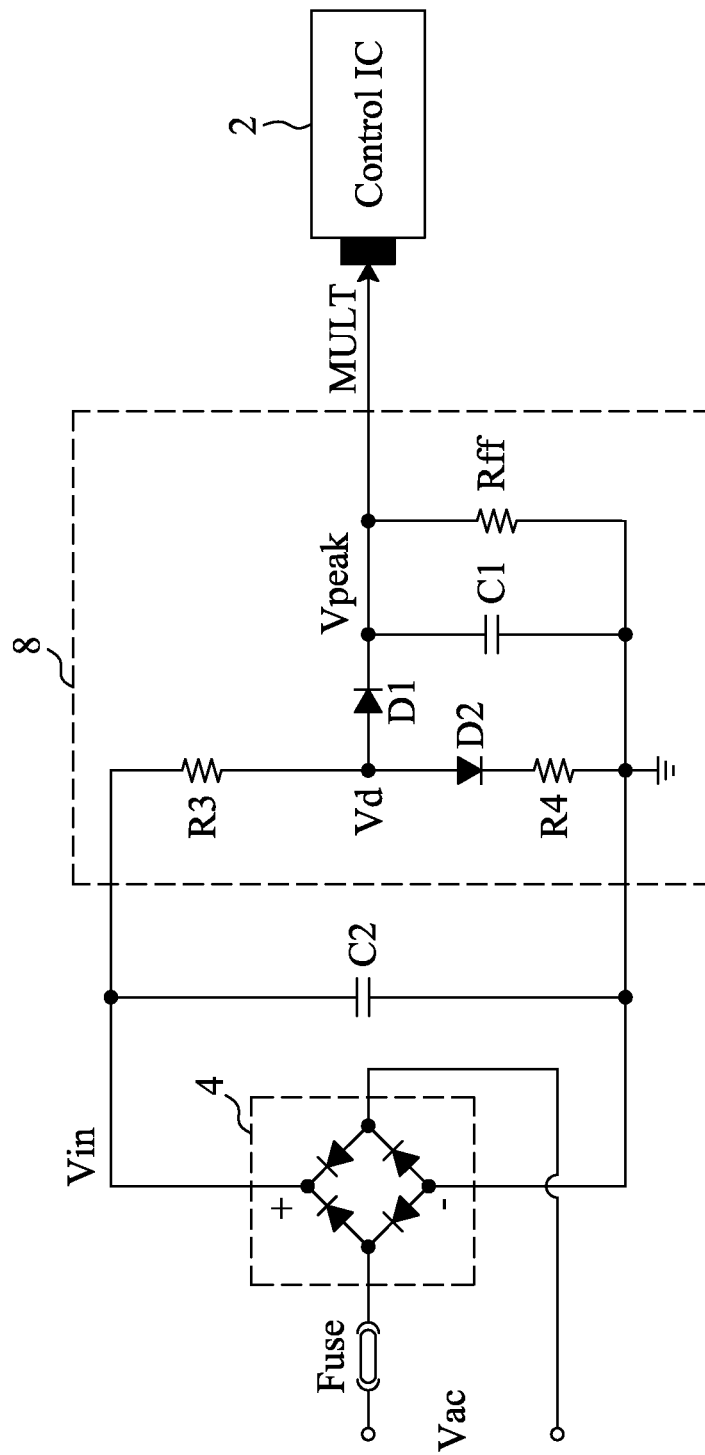
FIG. 5 shows another conventional signal peak detector applicable to a PFC converter.
Figure 6:
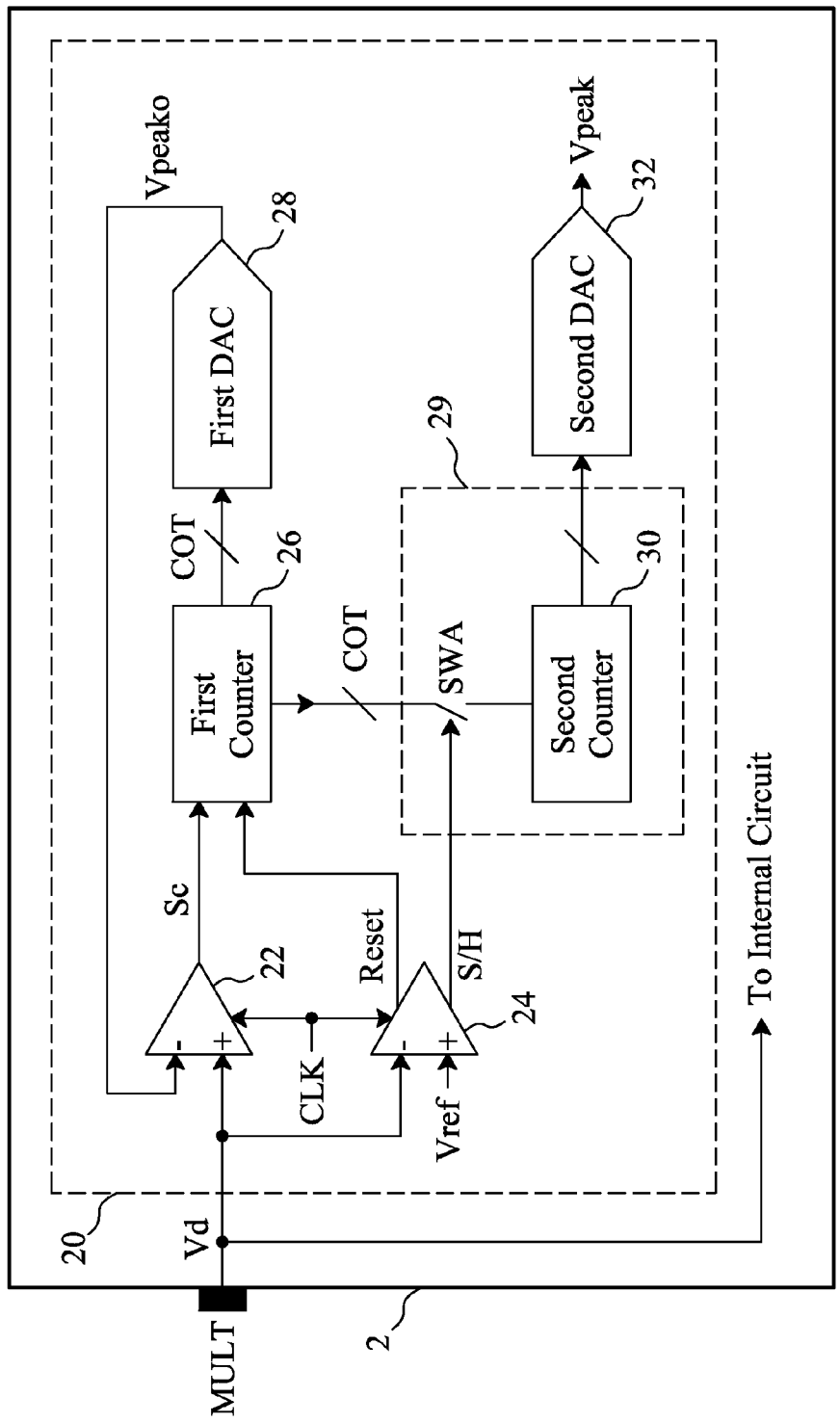
FIG. 6 shows a control IC according to the present invention.

FIG. 6 shows an embodiment of a control IC 2 according to the present invention. Referring to FIG. 1, the alternating voltage Vac is rectified by the bridge rectifier 4 so that the input signal Vin is obtained. The divider circuit 6 divides the input signal Vin to generate the input signal Vd to the pin MULT of the control IC 2, for the internal circuit of the control IC 2 to obtain the alternating-current information of the input signal Vin. In FIG. 6, the control IC 2 comprises a peak detector 20 using the pin MULT to detect the peak of the input signal Vd to generate the output peak signal Vpeak for obtaining the DC information of the input signal Vin. Since the same pin MULT is used to obtain the alternating-current and DC information of the input signal Vin, the control IC 2 of the present invention can reduce the number of the pins required. In the peak detector 20 of FIG. 6, a first comparator 22 is connected to the pin MULT for comparing the input signal Vd with an internal peak signal Vpeako. When the input signal Vd is higher than the internal peak signal Vpeako, the first comparator 22 generates a comparison signal Sc. A first counter 26 increases a count COT according to the comparison signal Sc. A first digital-to-analog converter 28 converts the count COT into the internal peak signal Vpeako. A second comparator 24 is connected to the pin MULT for comparing a reference voltage Vref with the input signal Vd, and when the input signal Vd is lower than the reference voltage Vref, generating a sampling signal S/H and a resetting signal Reset successively for a storage unit 29 and the first counter 26, respectively. The storage unit 29 comprises a switch SWA and a second counter 30. The second counter 30 is connected to the first counter 26 through the switch SWA. When the sampling signal S/H turns on the switch SWA, the second counter 30 obtains the count COT from the first counter 26 and stores the count COT. The second digital-to-analog converter 32 generates an output peak signal Vpeak according to the count COT stored in the second counter 30. Therein, the working frequency of the first comparator 22 and the second comparator 24 is determined by a working clock CLK.

Figure 7:
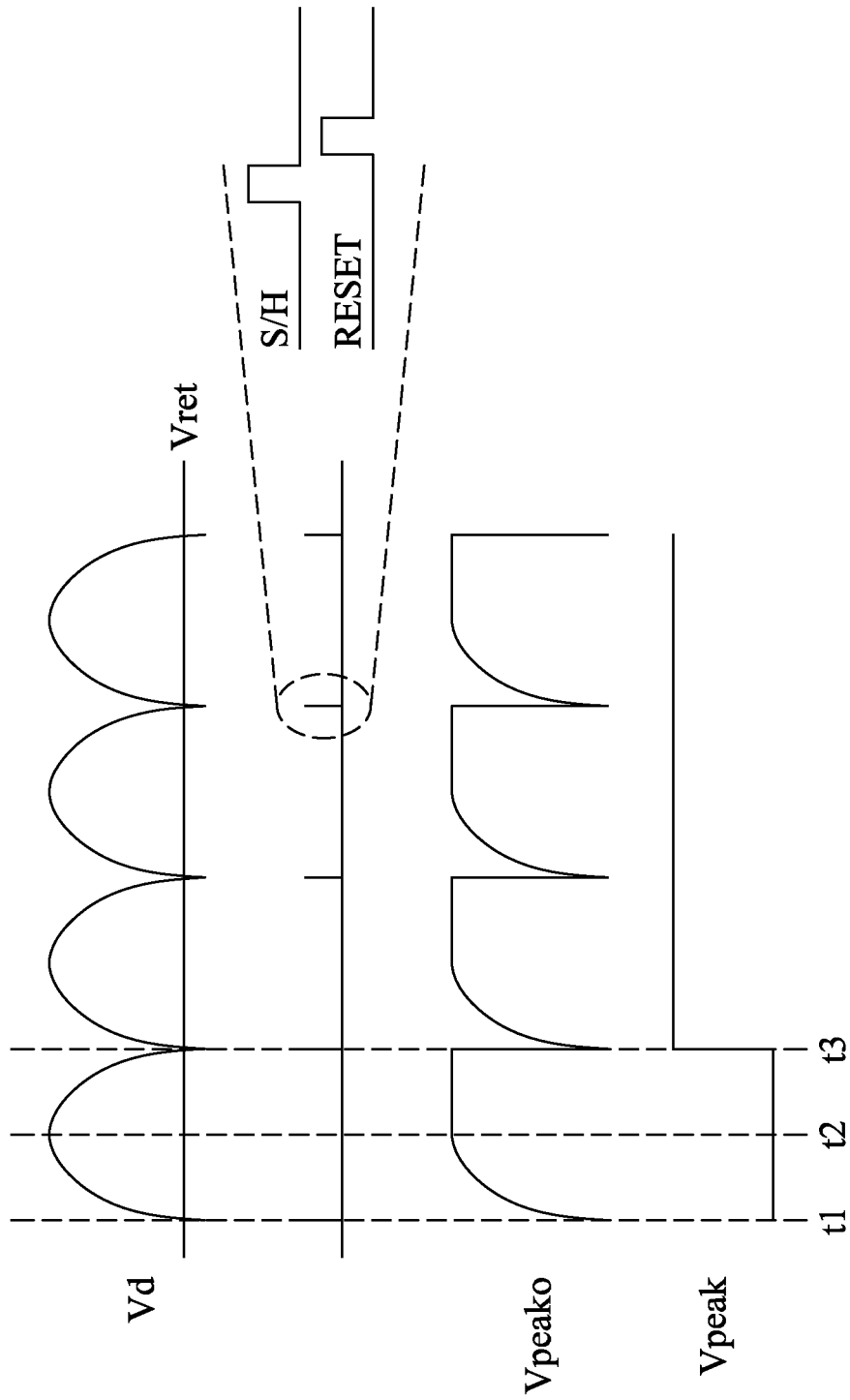
FIG. 7 shows a waveform diagram of the signals of FIG. 6.

FIG. 7 is a waveform diagram of the signals of FIG. 6. Referring to FIG. 6 and FIG. 7, when the input signal Vd rises, as shown between time points t1 and t2 in FIG. 7, the input signal Vd is greater than the internal peak signal Vpeako, so the comparison signal Sc is outputted under the control of the working clock CLK of the first comparator 22 for the first counter 26 to increase the count COT, thereby rising the internal peak signal Vpeako. Thus, the internal peak signal Vpeako rises with the input signal Vin. When the input signal Vd reaches the peak, it starts to fall, as shown at the time point t2. During the input signal Vd is falling, the input signal Vd is smaller than the internal peak signal Vpeako, so the first comparator 22 stops outputting the comparison signal Sc, so the count COT stops increasing. Since the count COT remains unchanged, the internal peak signal Vpeako remains unchanged. When the input signal Vd is smaller than the reference voltage Vref, as shown at the time point t3, the second comparator 24 first generates the sampling signal S/H to turn on the switch SWA, to make the second counter 30 obtain and store the count COT. The second digital-to-analog converter 32 then generates the output peak signal Vpeak according to the count COT stored in the second counter 30. After the sampling signal S/H ends, the second comparator 24 sends out the resetting signal Reset to the first counter 26 for resetting the count COT, which in turn makes the internal peak signal Vpeako rest. The signal peak detector 20 at the beginning of each cycle recount the count COT to detect the peak of the input signal, and determines the output peak signal Vpeak for the next cycle according to the obtained count COT. Therefore, no matter the peak of the input signal Vin is turning to high from low or turning to low from high, the peak detector 20 can have a quick transient response.

Figure 8:
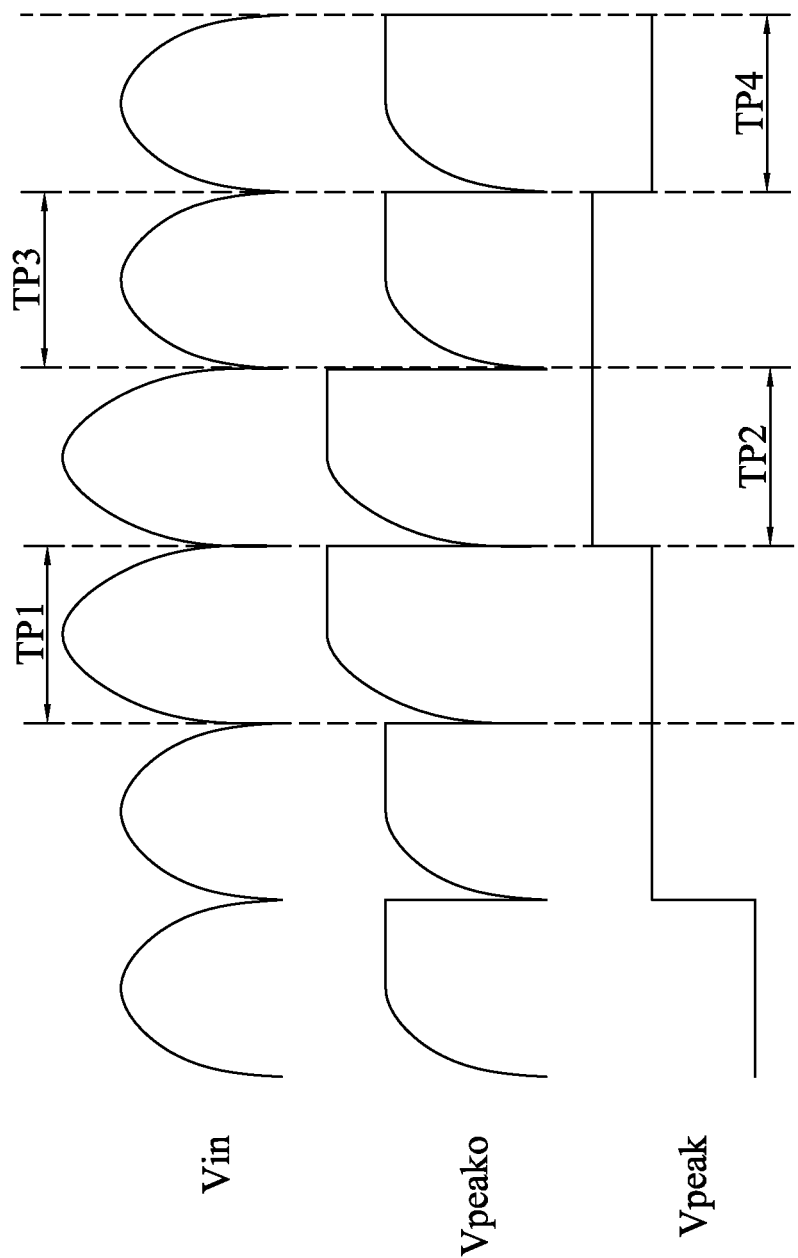
FIG. 8 shows the transient response of the output peak signal in FIG. 6 when the input signal has its peak changes.

More particularly, referring to FIG. 6 and FIG. 8, during the period TP1 of the input signal Vin, the peak of the input signal Vin is higher than that of the previous period. At the beginning of the period TP1, recounting is performed to obtain the count COT related to the peak of the input signal Vin. At the beginning of the period TP2 following the period TP1, the second counter 30 stores the count COT obtained in the cycle TP1 to generate the output peak signal Vpeak corresponding to the peak of the input signal Vin in the period TP1. During the period TP3, the peak of the input signal Vin is lower than that in the previous period TP2. At the beginning of the period TP3, the count COT recounts. At the beginning of the period TP4 that follows the period TP3, the second counter 30 stores the count COT obtained in the period TP3 to generate the output peak signal Vpeak corresponding to the peak of the input signal Vin in the period TP3. As can be seen from FIG. 8, no matter the peak of the input signal Vin is turning to high from low or turning to low from high, the signal peak detector 20 needs only one cycle to adjust the output peak signal Vpeak to the target level, so it can provide fast transient response.

Figure 9:
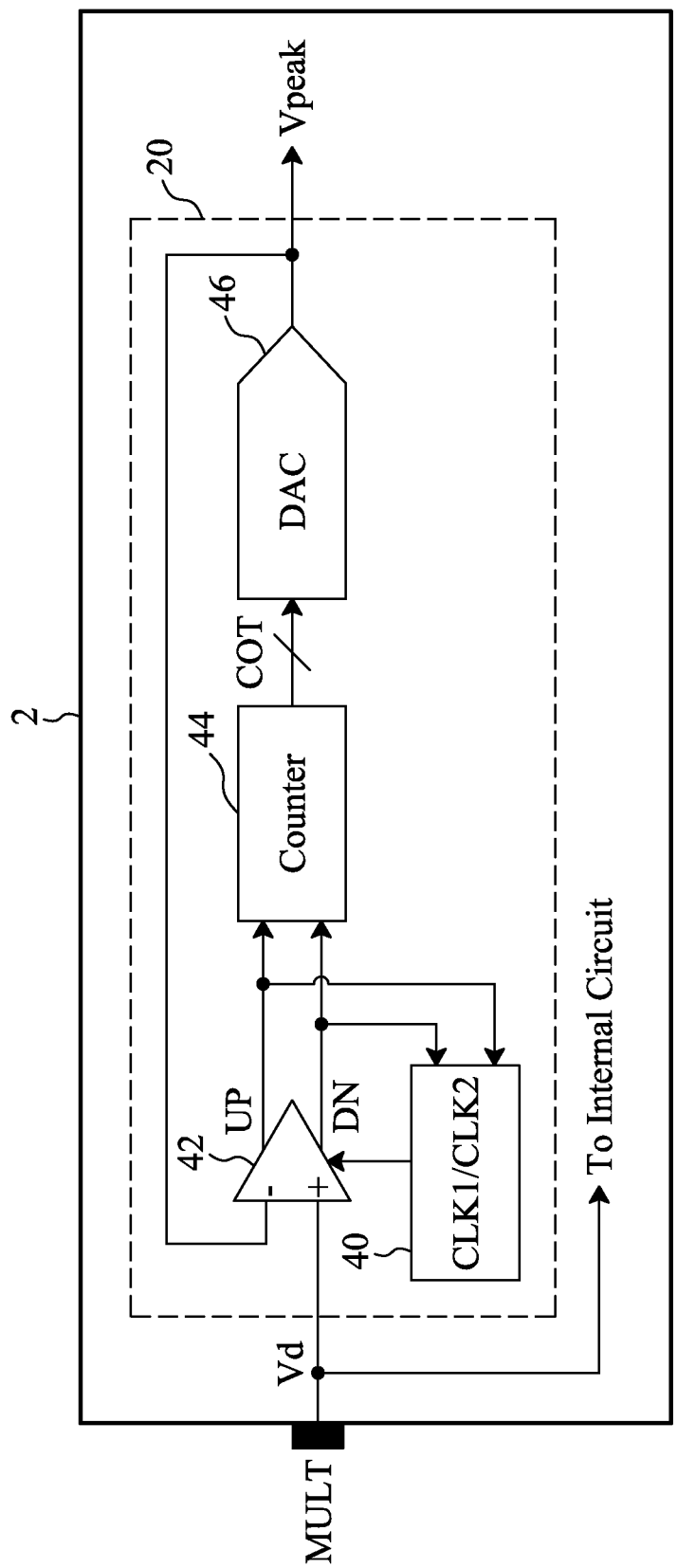
FIG. 9 shows another embodiment of the signal peak detector of FIG. 6.
Figure 10:
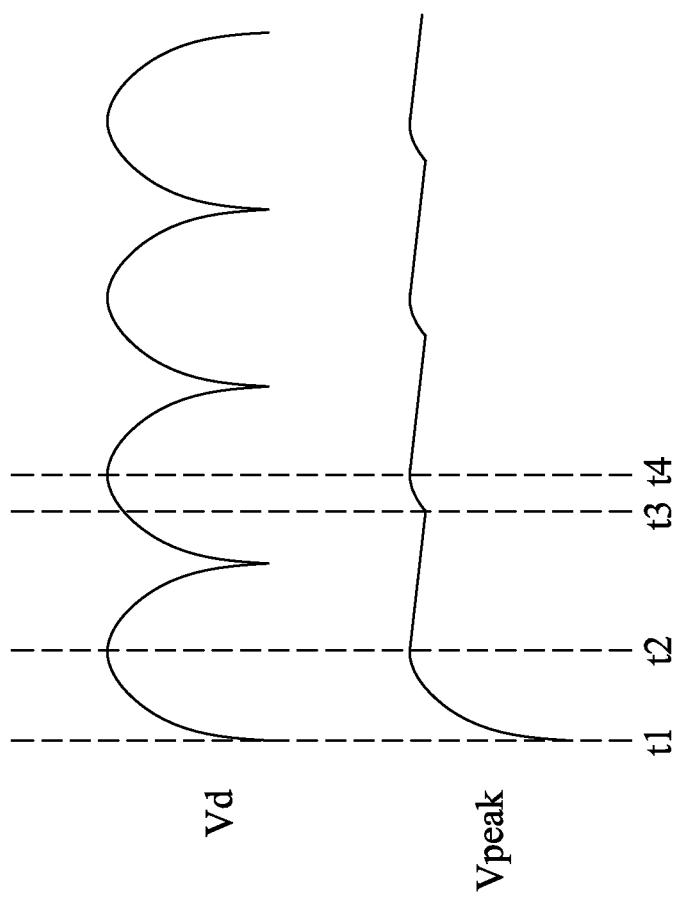
FIG. 10 shows a waveform diagram of the input signal Vd and the peak signal in FIG. 9.

FIG. 9 shows another embodiment of the signal peak detector 20, which also uses the pin MULT detecting the alternating-current information to detect the peak of the input signal Vd, to generate the output peak signal Vpeak for obtaining the DC information of the input signal Vin. Since the same pin MULT is used to obtain the alternating-current information and the DC information of the input signal Vin, the number of pins required is reduced. The signal peak detector 20 of FIG. 9 comprises a clock generator 40, a comparator 42, a counter 44 and a digital-to-analog converter 46. The comparator 42 is connected to the pin MULT of the control IC 2 and serves to compare the output peak signal Vpeak with the input signal Vd to generate a rising signal UP or a falling signal DN. When the input signal Vd is greater than the output peak signal Vpeak, the comparator 42 sends out the rising signal UP. When the input signal Vd is smaller than the output peak signal Vpeak, the comparator 42 sends out the falling signal DN. The counter 44 increases the count COT according to the rising signal UP or decreases the count COT according to the falling signal DN. The digital-to-analog converter 46 generates the output peak signal Vpeak according to the count COT. The clock generator 40 provides a working clock CLK1 or CLK2 for the comparator 42, to determine the working frequency for the comparator 42. Therein, the frequency of the working clock CLK1 is higher than the frequency of the working clock CLK2. When the input signal Vd is greater than the output peak signal Vpeak, as shown between time points t1 and t2 and between time points t3 and t4 in FIG. 10, the comparator 42 sends out the rising signal UP. When the clock generator 40 receives the rising signal UP, it provides the working clock CLK1 to the comparator 42, so that comparator 42 has a higher working frequency, and thereby the count COT is increased in a higher frequency, making the output signal peakVpeak rises with the input signal Vin quickly. When the input signal Vd is smaller than the output peak signal Vpeak, as shown between the time points t2 and t3 in FIG. 10, the comparator 42 sends out the falling signal DN. When the clock generator 40 receives the falling signal DN, it provides the working clock CLK2 to the comparator 42, so the working frequency of the comparator 42 is lowered, and the count COT will decrease in a low frequency, thereby stabilizing the output peak signal Vpeak at the peak.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A control integrated circuit for a power factor correction converter, comprising:
    a pin configured to receive an input signal for the control integrated circuit to obtain an alternating-current information of the input signal; and
    a signal peak detector connected to the pin, configured to detect a peak of the input signal to generate an output peak signal having a direct-current information of the input signal, the signal peak detector comprising:
    a first comparator connected to the pin, configured to generate a comparison signal when the input signal is greater than an internal peak signal;
    a first counter connected to the first comparator, configured to increase a count it outputs according to the comparison signal and reset the count responsive to a resetting signal;
    a first digital-to-analog converter connected to the first comparator and the first counter, configured to convert the count into the internal peak signal;
    a storage unit connected to the first counter, configured to obtain from the first counter and store the count in response to a sampling signal;
    a second comparator connected to the pin, configured to generate the sampling signal when the input signal is lower than a reference voltage, and generate the resetting signal when the sampling signal ends; and
    a second digital-to-analog converter connected to the storage unit, configured to convert the count stored in the storage unit into the output peak signal.

2. The control integrated circuit of claim 1, wherein a working frequency of the first and second comparators is determined by a clock.

3. The control integrated circuit of claim 1, wherein the storage unit comprises:
    a switch connected to the first counter, configured to be turned on responsive to the sampling signal; and
    a second counter connected to the first counter through the switch, and connected to the second digital-to-analog converter, configured to obtain from the first counter and store the count when the switch is turned on.

4. A control integrated circuit for a power factor correction converter, comprising:
    a pin configured to receive an input signal for the control integrated circuit to obtain an alternating-current information of the input signal; and
    a signal peak detector connected to the pin, configured to detect a peak of the input signal to generate an output peak signal having a direct-current information of the input signal, the signal peak detector comprising:
    a comparator connected to the pin, configured to compare the input signal with the output peak signal to generate a rising signal or a falling signal;
    a counter connected to the comparator, configured to increase and decrease a count it outputs according to the rising signal and the falling signal, respectively; and
    a digital-to-analog converter connected to the comparator and the counter, configured to convert the count into the output peak signal;
    wherein the count is increased in a first frequency and is decreased in a second frequency lower than the first frequency.

5. The control integrated circuit of claim 4, further comprising a clock generator connected to the comparator, configure to provide a first clock having the first frequency when receiving the rising signal, so as to determine a working frequency for the comparator, and provide a second clock having the second frequency when receiving the falling signal, so as to determine the working frequency for the comparator.

6. A signal peak detector for detecting a peak of an input signal to generate an output peak signal, comprising:
    a first comparator configured to generate a comparison signal when the input signal is higher than an internal peak signal;
    a first counter connected to the first comparator, configured to increase a count it outputs according to the comparison signal, and reset the count according to a resetting signal;
    a first digital-to-analog converter connected to the first comparator and the first counter, configured to convert the count into the internal peak signal;
    a storage unit connected to the first counter, configured to obtain from the first counter and store the count according to a sampling signal;
    a second comparator connected to the first counter and the storage unit, configured to generate the sampling signal when the input signal is lower than a reference voltage, and generate the resetting signal when the sampling signal ends; and
    a second digital-to-analog converter connected to the storage unit, configured to convert the count stored in the storage unit into the output peak signal.

7. The signal peak detector of claim 6, wherein a working frequency of the first and second comparators is determined by a clock.

8. The signal peak detector of claim 6, wherein the storage unit comprises:
    a switch connected to the first counter, configured to be turned on responsive to the sampling signal; and
    a second counter connected to the first counter through the switch, and connected to the second digital-to-analog converter, configured to obtain from the first counter and store the count when the switch is turned on.

* * * * *